(12) United States Patent
Tamari et al.

(10) Patent No.: US 12,154,765 B2
(45) Date of Patent: Nov. 26, 2024

(54) PLASMA PROCESSING APPARATUS AND PLASMA PROCESSING METHOD

(71) Applicant: Hitachi High-Tech Corporation, Tokyo (JP)

(72) Inventors: Nanako Tamari, Tokyo (JP); Kosa Hirota, Tokyo (JP); Masahiro Sumiya, Tokyo (JP); Masahiro Nagatani, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 0 days.

(21) Appl. No.: 17/275,420

(22) PCT Filed: Feb. 3, 2020

(86) PCT No.: PCT/JP2020/003894
§ 371 (c)(1),
(2) Date: Mar. 11, 2021

(87) PCT Pub. No.: WO2021/156906
PCT Pub. Date: Aug. 12, 2021

(65) Prior Publication Data
US 2022/0359166 A1   Nov. 10, 2022

(51) Int. Cl.
*H01J 37/32* (2006.01)

(52) U.S. Cl.
CPC .. *H01J 37/32522* (2013.01); *H01J 37/32146* (2013.01); *H01J 37/32201* (2013.01); *H01J 2237/334* (2013.01)

(58) Field of Classification Search
CPC ............ H01J 37/32; H01J 37/32522; H01J 37/32146; H01J 2237/334; H01J 37/32201; H01L 21/3065
See application file for complete search history.

(56) References Cited

U.S. PATENT DOCUMENTS

| 5,925,212 A | 7/1999 | Rice et al. |
| 2003/0003607 A1 | 1/2003 | Kagoshima et al. |

(Continued)

FOREIGN PATENT DOCUMENTS

| JP | H08008232 A | 1/1996 |
| JP | H09172003 A | 6/1997 |

(Continued)

OTHER PUBLICATIONS

Office Action mailed Apr. 15, 2022 in Korean Application No. 10-2021-7002241.

(Continued)

*Primary Examiner* — Yuechuan Yu
(74) *Attorney, Agent, or Firm* — Miles & Stockbridge, P.C.

(57) ABSTRACT

A plasma processing apparatus including a plasma processing chamber in which an electrode for placing a substrate to be processed is provided; a power supply; and a control device configured to control the power supply, in which the control device is configured to execute heat-retaining discharge under a first condition in which the substrate is not placed on the electrode inside the plasma processing chamber to generate first plasma to heat an inner wall surface to a first temperature, rapid temperature control discharge under a second condition to generate second plasma inside the plasma processing chamber to heat the inner wall surface to a second temperature higher than the first temperature, and product processing of controlling the power supply under a third condition in a state where the substrate is placed on the electrode to generate third plasma inside the plasma processing chamber to process the substrate.

3 Claims, 5 Drawing Sheets

(56) References Cited

U.S. PATENT DOCUMENTS

| | | |
|---|---|---|
| 2005/0189070 A1 | 9/2005 | Tanaka et al. |
| 2009/0229635 A1 | 9/2009 | Numakura et al. |
| 2011/0083808 A1 | 4/2011 | Kagoshima et al. |
| 2011/0265813 A1 | 11/2011 | Okai et al. |
| 2014/0277626 A1 | 9/2014 | Kagoshima et al. |
| 2015/0064923 A1 | 3/2015 | Matsumoto et al. |
| 2016/0155611 A1 | 6/2016 | Kagoshima et al. |
| 2019/0100840 A1 | 4/2019 | Kagoshima et al. |

FOREIGN PATENT DOCUMENTS

| | | | |
|---|---|---|---|
| JP | H10130872 A | | 5/1998 |
| JP | 2005244065 A | | 9/2005 |
| JP | 2006210948 A | | 8/2006 |
| JP | 2010219198 A | * | 9/2010 |
| JP | 2011003712 A | | 1/2011 |
| JP | 2011082441 A | | 4/2011 |
| JP | 2011233721 A | | 11/2011 |
| JP | 2016103496 A | | 6/2016 |
| KR | 20140031949 A | | 3/2014 |
| KR | 10-2015-0016491 A | | 2/2015 |

OTHER PUBLICATIONS

Search Report mailed Mar. 17, 2020 in corresponding International Application No. PCT/JP2020/003894.

* cited by examiner

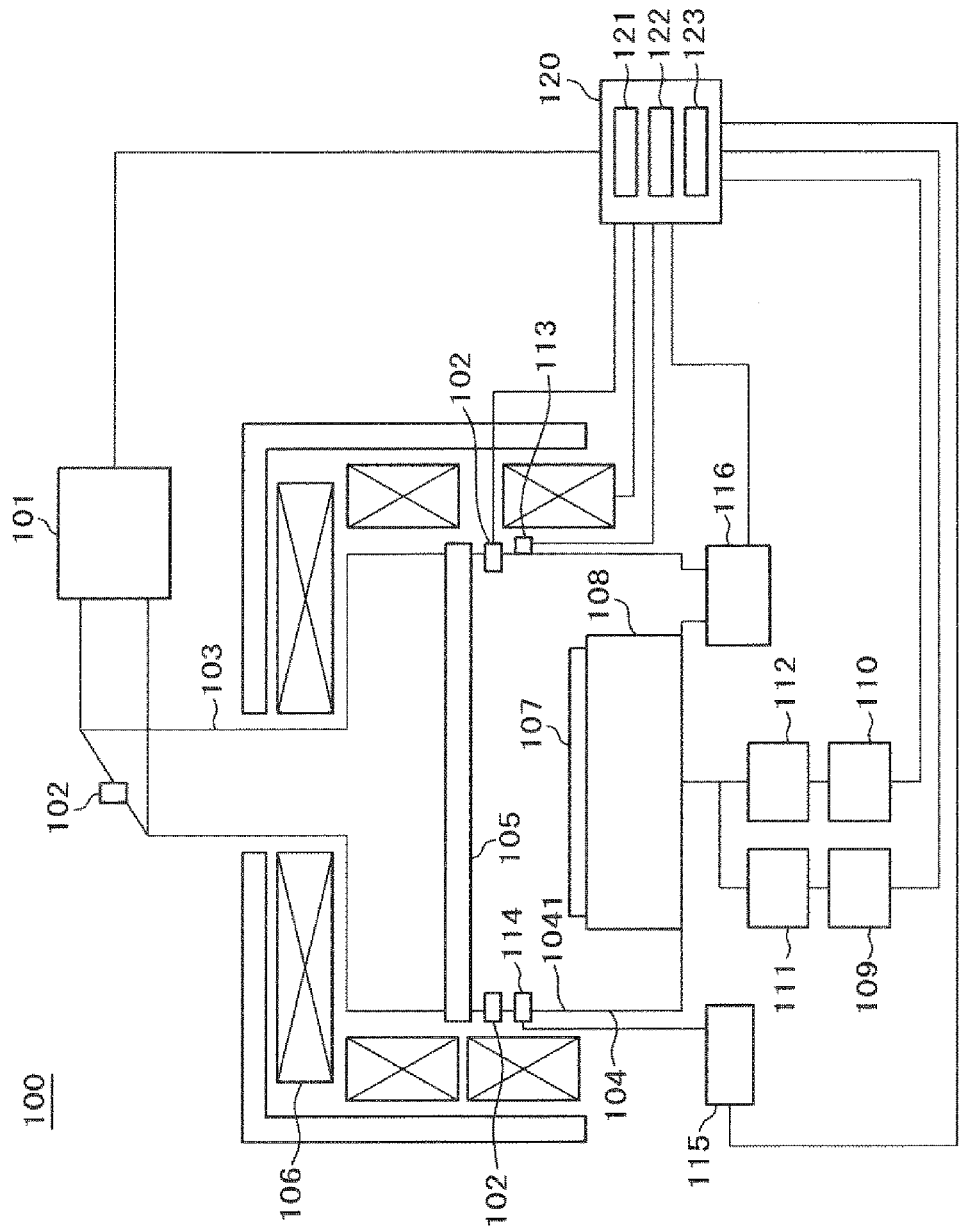
[FIG. 1]

[FIG. 3]
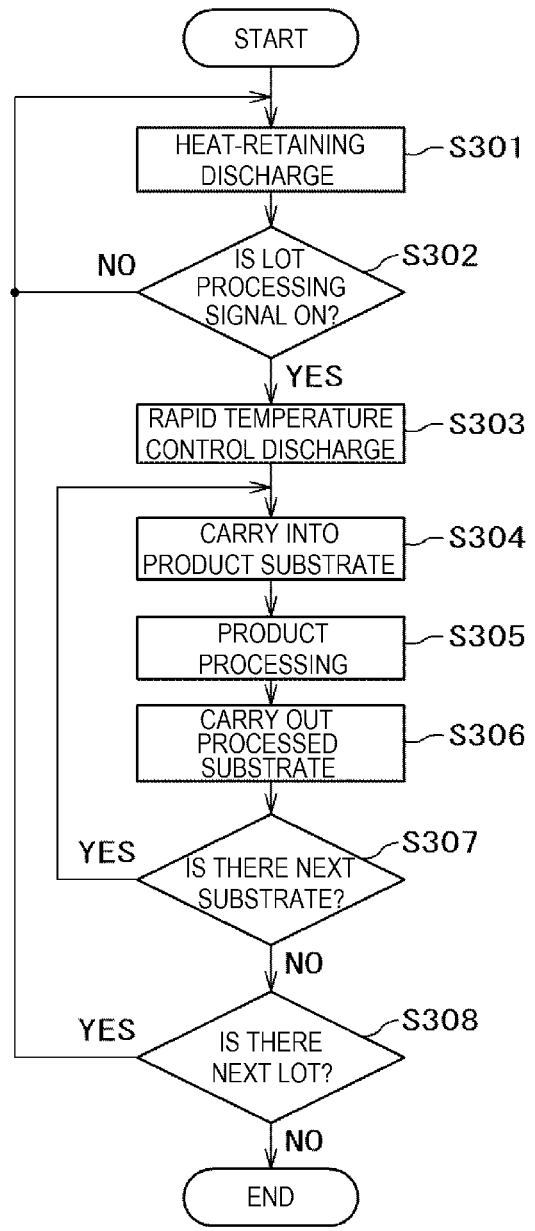

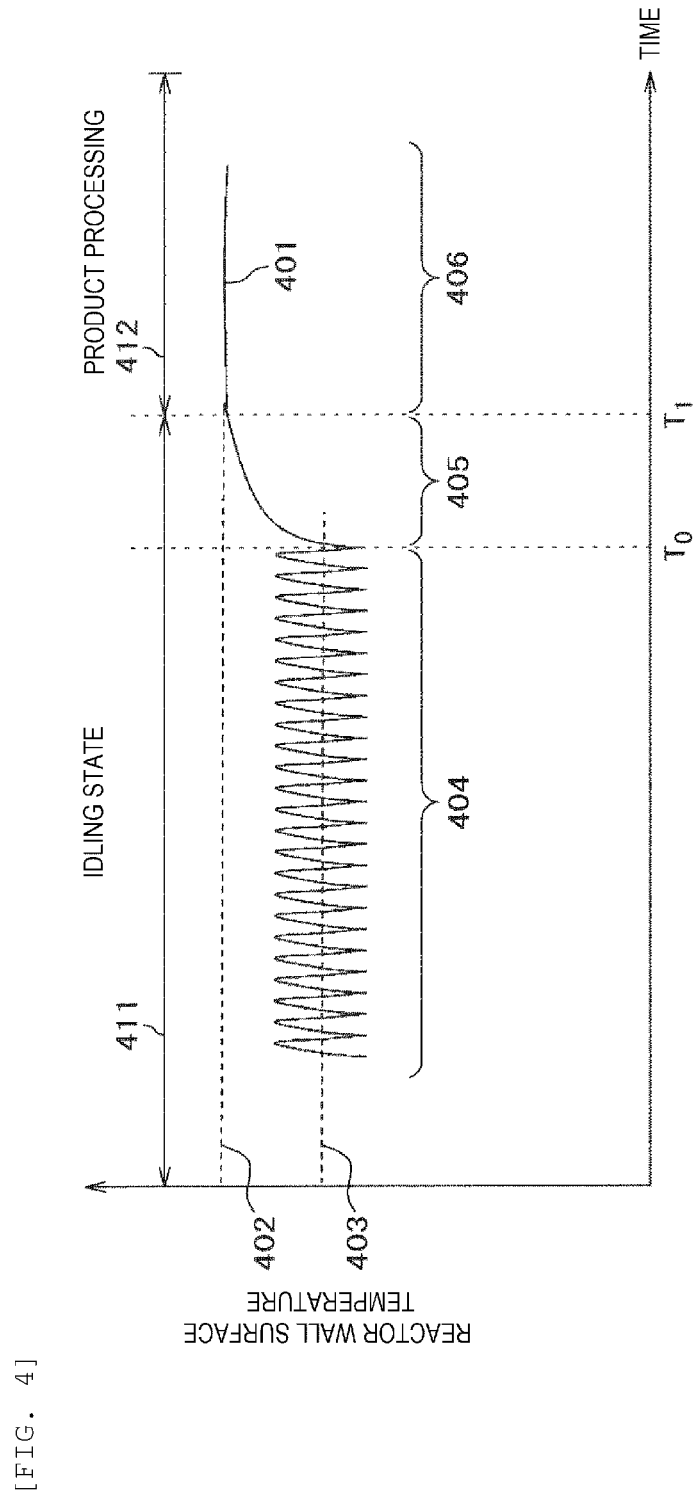

PLASMA PROCESSING APPARATUS AND PLASMA PROCESSING METHOD

TECHNICAL FIELD

The present invention relates to a plasma processing apparatus and a plasma processing method.

BACKGROUND ART

In a semiconductor manufacturing process, dry etching using plasma is generally performed. A plasma processing apparatus for performing dry etching is used in various methods.

Generally, the plasma processing apparatus includes: a vacuum processing chamber; a gas supply device that is connected to the vacuum processing chamber; a vacuum exhaust system that maintains a pressure in the vacuum processing chamber at a desired value; an electrode that places a substrate to be processed; a plasma generating means that generates plasma in the vacuum processing chamber, and the like.

By bringing a processing gas supplied into the vacuum processing chamber from a shower plate or the like into a plasma state by the above-described plasma generating means, the etching processing of the substrate to be processed held on the electrode for placing the substrate to be processed is performed.

Etching of the substrate to be processed proceeds by physical sputtering or a chemical reaction with ions or radicals emitted from the plasma or a reactor wall. Therefore, an etching amount of the substrate to be processed is affected not only by the plasma state but also by an amount of the radicals released from a reactor wall surface or adsorbed on the reactor wall surface.

Here, one main factor that determines the amount of the radicals released from or adsorbed on the reactor wall surface is a reactor wall surface temperature. Generally, the reactor wall surface temperature is raised by plasma heat input in addition to an electric heater. The reactor wall surface is in a state where the temperature thereof is raised by the plasma heat input during plasma discharge, but when the apparatus is in a processing standby state (hereinafter referred to as idling state) after the plasma discharge is ended, the reactor wall surface temperature gradually decreases as a processing standby time (hereinafter referred to as idling time) elapses.

Therefore, for example, in a case where a plurality of substrates to be processed are continuously processed under the same etching conditions, when the apparatus is in the idling state for a long time before the processing of the first substrate, there is a significant discrepancy between the reactor wall surface temperature immediately after the start of processing and the reactor wall surface temperature after processing time continues. Therefore, there may be a difference in the etching amount between the first substrate to be processed and the substrates to be processed in the latter half.

In recent years, with miniaturization and complexity of structures of semiconductor devices, the difference in the etching amount between the substrates to be processed as described above is likely to directly affect a yield of device manufacturing even if the difference is small, and thus from a viewpoint of mass-production stability, controlling the reactor wall surface temperature is one important problem that cannot be overlooked.

In a plasma etching apparatus, in order to solve the above problem, the following temperature control techniques for the reactor wall surface are used. PTL 1 discloses a technique for raising a reactor wall surface temperature by performing plasma discharge under preset conditions before substrate processing. Further, PTL 2 discloses a technique for raising a reactor wall surface temperature by performing intermittent discharge during idling of an apparatus.

CITATION LIST

Patent Literature

PTL 1: JP-A-2006-210948
PTL 2: JP-A-2010-219198

SUMMARY OF INVENTION

Technical Problem

The technique disclosed in PTL 1 aims to raise the temperature of the reactor by performing the plasma discharge before the substrate processing, but when this temperature raising process is performed after the apparatus has been idle for a long time such as several hours, long-time discharge is required to sufficiently raise the temperature. This causes a decrease in throughput and is a problem from a viewpoint of cost performance.

Further, the technique disclosed in PTL 2 is to perform the intermittent discharge during the idling of the apparatus to raise the reactor wall surface temperature. Here, when the idling state is ended and a plurality of substrates are actually processed, a finally reached reactor wall surface temperature (hereinafter referred to as saturation temperature) is generally determined by average radio frequency power applied, and thus an appropriate reactor wall surface temperature differs depending on substrate processing conditions.

Therefore, when prior processing is ended and the apparatus shifts to the idling state, if the conditions of next processing are known in advance, the reactor wall surface temperature can be raised to an appropriate temperature for the processing conditions, but if the conditions of the next processing are unknown, it is difficult to set a target temperature. Further, when the saturation temperature under the processing conditions of a prior substrate is higher than the saturation temperature under the processing conditions of the substrate to be processed next, the intermittent discharge during the idling for the purpose of temperature raising causes a chamber wall surface temperature to become overheated, which may rather promote the discrepancy in the etching amount between the substrates to be processed.

The invention solves the above-described problems of the prior art, and provides a plasma processing apparatus and a plasma processing method capable of, when product processing of the prior substrate to be processed is ended and the apparatus is idle, bringing a chamber wall surface temperature to a target saturation temperature in a short time even when an idling time of the apparatus is sufficiently long and a reactor wall surface temperature drops significantly compared to a saturation temperature of a reactor wall surface under product processing conditions that are processing conditions for performing plasma processing on the substrate to be processed next, or when the product processing conditions of the substrate to be processed next are unknown.

Solution to Problem

In order to solve the above-described problems of the prior art, the invention provides a plasma processing apparatus including: a plasma processing chamber in which an electrode for placing a substrate to be processed is provided; a power supply unit configured to supply power for plasma generation to the plasma processing chamber; and a control device configured to control the power supplied from the power supply unit to the plasma processing chamber, in which, the control device is configured to execute heat-retaining discharge of controlling the power supply unit under a first condition in a state where the substrate to be processed is not placed on the electrode inside the plasma processing chamber to generate first plasma inside the plasma processing chamber to heat an inner wall surface of the plasma processing chamber to a first temperature, rapid temperature control discharge of controlling the power supply unit under a second condition in a state where the substrate to be processed is not placed on the electrode inside the plasma processing chamber to generate second plasma inside the plasma processing chamber to heat the inner wall surface of the plasma processing chamber to a second temperature higher than the first temperature and product processing of controlling the power supply unit under a third condition in a state where the substrate to be processed is placed on the electrode inside the plasma processing chamber to generate third plasma inside the plasma processing chamber to process the substrate to be processed.

Further, in order to solve the above-described problems of the prior art, the invention provides a method of processing a substrate to be processed using the plasma processing apparatus, in which power is applied to a plasma processing chamber of the plasma processing apparatus under a first condition in a state where the substrate to be processed is not placed on an electrode inside the plasma processing chamber to generate first plasma inside the plasma processing chamber to heat an inner wall surface of the plasma processing chamber to a first temperature, then power is applied under a second condition in a state where the substrate to be processed is not placed on the electrode inside the plasma processing chamber to generate second plasma inside the plasma processing chamber to heat the inner wall surface of the plasma processing chamber to a second temperature higher than the first temperature, and power is applied under a third condition in a state where the substrate to be processed is placed on the electrode inside the plasma processing chamber to generate third plasma inside the plasma processing chamber to process the substrate to be processed.

Advantageous Effect

According to the invention, when the product processing of a prior substrate to be processed is ended and the apparatus is idle, even when the idling time of the apparatus is sufficiently long and the reactor wall surface temperature drops significantly compared to the saturation temperature under product processing conditions of the substrate to be processed next or when the product processing conditions of the substrate to be processed next are unknown, it is possible to bring the chamber wall surface temperature to the target saturation temperature in a short time, and it is possible to stably maintain a yield in etching processing in a high state.

BRIEF DESCRIPTION OF DRAWINGS

FIG. 1 is a block diagram showing a schematic configuration of a microwave ECR plasma etching apparatus according to an embodiment of the invention.

FIG. 3 is a flowchart showing a flow of discharge control before carrying into the substrate and product processing of the substrate to be processed according to the embodiment of the invention.

FIG. 4 is a graph showing relationships of the idling state and the product processing time of the substrate to be processed with the reactor wall surface according to the embodiment of the invention.

DESCRIPTION OF EMBODIMENTS

Figures 2A, 2B:
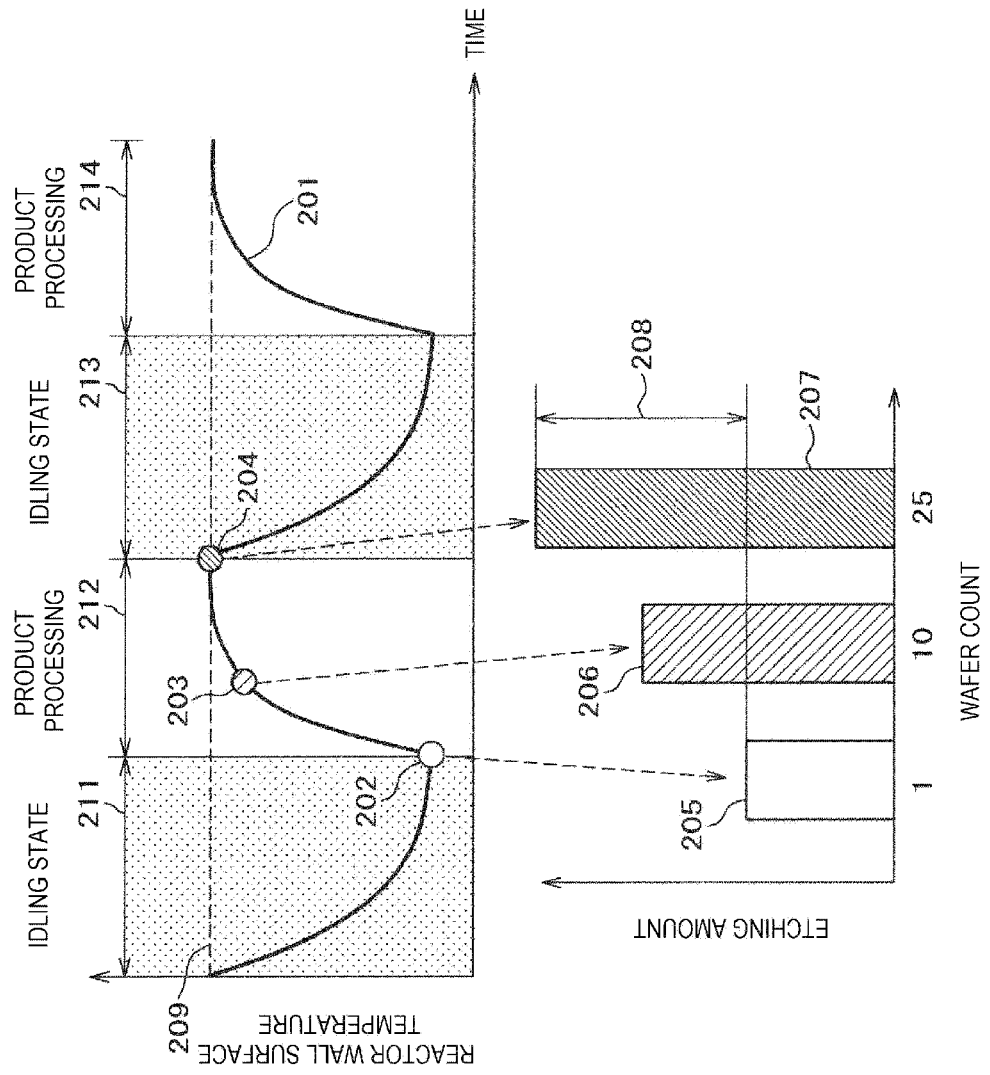
FIG. 2A is a graph showing relationships of an idling state and a product processing time of a substrate to be processed with a reactor wall surface temperature when the invention is not applied.
FIG. 2B is a graph showing a relationship between a wafer count and an etching amount when the invention is not applied.

The invention relates to a plasma processing apparatus and a plasma processing method that repeatedly supply a magnetic field into a processing chamber at predetermined intervals to increase or decrease an intensity to form plasma to process a sample in a state where a temperature in the processing chamber is controlled by heat input from plasma to a processing chamber wall surface.

While sequentially processing a plurality of substrates in a lot using a plasma processing apparatus, a temperature of a chamber wall surface changes due to plasma heat input, but when an initial temperature of the lot is significantly dissociated from a saturation temperature of the lot, there is a difference in etching rate within the same lot, which leads to a decrease in a yield.

In order to prevent this phenomenon, it is essential to alleviate the dissociation between the initial temperature and the saturation temperature of the lot. Therefore, the invention solves the problem by making a wall temperature reach near the saturation temperature of the same lot at an initial stage of the lot.

That is, in the invention, in a configuration in which when the substrates to be processed are processed by the plasma processing apparatus, during idling before lot processing, a temperature of an inner wall surface of the chamber is raised by plasma discharge generated by radio frequency power pulse-modulated to a predetermined average power, and then plasma discharge is performed prior to the lot processing performed next to adjust the temperature of the inner wall surface of the chamber, the predetermined average power for the plasma discharge during the idling is set lower than an average input power for a plurality of lot processing conditions performed by the apparatus, and the plasma discharge performed prior to the lot processing is set to the average input power of the lot processing conditions.

Accordingly, the temperature of the inner wall surface of the chamber at the start of the lot processing can be adjusted to near a saturation temperature of the inner wall surface of the chamber under the lot processing conditions, and by suppressing variations in an etching rate of the substrates to be processed in the lot, the yield can be improved.

Further, in the invention, the temperature of the wall surface of the processing chamber is raised during idling by the plasma generated by the pulse-modulated radio frequency power, and then the radio frequency power is further controlled based on the lot processing conditions to raise the temperature of the wall surface of the processing chamber. Accordingly, a temperature change on the wall surface of the processing chamber between the start and the end of the lot processing is reduced, and in the plasma processing, variations in quality of the processing lot of the substrates to be processed due to the temperature change of the wall surface of the processing chamber are reduced.

Further, in the invention, during entire time when the prior processing is ended and the apparatus is in the idling state, a reactor wall surface temperature is adjusted by the plasma discharge formed by the pulse-modulated radio frequency power set to the predetermined average power, and then before starting the processing of the next substrate to be processed, the reactor wall surface temperature is raised by the plasma discharge generated by the predetermined power based on the product processing conditions of the substrate to be processed.

The predetermined power is characterized by being a value determined so that a time from the reactor wall surface temperature that has been raised in advance to a time until a target saturation temperature is reached becomes a predetermined value.

According to the invention, when the processing of the prior substrate to be processed is ended and the apparatus is idle, even when the idling time of the apparatus is sufficiently long and the reactor wall surface temperature drops significantly compared to the saturation temperature of the reactor wall surface under the conditions of the substrate to be processed next or when the processing conditions of the substrate to be processed next are unknown, it is possible to bring the temperature of the chamber wall surface to the target saturation temperature in a short time, so as to suppress the variations caused by the temperature dependence of the etching rate in processing blocks, and to stably maintain the yield in the etching processing in a high state.

Hereinafter, an embodiment of the invention will be described with reference to the drawings.

EMBODIMENT

FIG. 1 is a block diagram showing a schematic configuration of a microwave ECR plasma etching apparatus 100 according to an embodiment of the invention.

The microwave ECR plasma etching apparatus 100 shown in FIG. 1 includes: an etching processing chamber 104; a microwave power source 101; a waveguide 103 that connects the microwave power source 101 and the etching processing chamber 104; a dielectric window 105 that encloses an etching gas introduced into the etching processing chamber 104 in the etching processing chamber 104 at an upper portion of the etching processing chamber 104 and introduces microwave power with a frequency of, for example, 2.45 GHz transmitted from the waveguide 103 into the etching processing chamber 104; and electromagnetic coils 106 arranged on an outer peripheral portion of the etching processing chamber 104 and for generating a magnetic field inside the etching processing chamber 104.

An electrode 108 for placing a substrate 107 to be processed is provided inside the etching processing chamber 104. The microwave ECR plasma etching apparatus 100 further includes: a DC power source 109 that applies a DC voltage for electrostatically attracting the substrate 107 to be processed placed on the electrode 108 to the electrode 108 by an action of an electrostatic attraction electrode (not shown); a radio frequency filter circuit 111 that cuts radio frequency power so that the radio frequency power does not flow into the DC power source 109; a radio frequency power source 110 that applies, on the electrode 108, the radio frequency power for drawing in ions in plasma to the substrate 107 to be processed placed on the electrode 108; and a matching circuit 112 that adjusts a radio frequency impedance of the electrode 108 with respect to the radio frequency power source 110. The electrode 108 is provided inside the etching processing chamber 104 by an insulating member (not shown).

In addition, the microwave ECR plasma etching apparatus 100 includes: a gas supply unit 114 that supplies a processing gas to the inside of the etching processing chamber 104; a gas flow rate control device 115 that controls a flow rate of the processing gas supplied from the gas supply unit 114 to the inside of the etching processing chamber 104; and a vacuum exhaust unit 116 that exhausts the inside of the etching processing chamber 104 to a vacuum.

Further, the microwave ECR plasma etching apparatus 100 includes light emitting monitor mechanisms 102 that monitor a plasma light emitting state and an etching state of the substrate 107 to be processed inside the etching processing chamber 104, and the like, and a temperature measuring instrument 113 that measures a temperature of an inner wall surface 1041 (reactor wall surface) of the etching processing chamber 104.

Reference numeral 120 denotes a control device, and the control device controls the microwave power source 101, the electromagnetic coils 106, the DC power source 109, the radio frequency power source 110, the gas flow rate control device 115, the vacuum exhaust unit 116, and the like. Further, for control by the control device 120 during idling and plasma processing, a signal received from the light emitting monitor mechanism 102 and temperature information of the reactor wall surface 1041 obtained by measuring with the temperature measuring instrument 113 may be used.

Further, the control device 120 includes a storage unit 121, a calculation unit 122, and a CPU 133. The storage unit 121 registers and stores programs for processing the substrate 107 to be processed by the microwave ECR plasma etching apparatus 100, and product processing conditions for controlling the microwave power source 101, the electromagnetic coils 106, the DC power source 109, the radio frequency power source 110, the gas flow rate control device 115, the vacuum exhaust unit 116, and the like.

The calculation unit 122 performs various calculation processing, and as an example, calculates, based on the product processing conditions stored in the storage unit 121, an average radio frequency power for plasma generation input from the microwave power source 101 during heat-retaining discharge described later, and an average radio frequency power for plasma generation input from the microwave power source 101 to the rapid temperature control discharge.

The CPU 133 controls the microwave power source 101, the electromagnetic coils 106, the DC power source 109, the radio frequency power source 110, the gas flow rate control device 115, the vacuum exhaust unit 116, and the like based on the programs and product processing conditions stored in the storage unit 121 and used for processing the substrate 107 to be processed by the microwave ECR plasma etching apparatus 100.

The control device 120 controls the microwave power source 101, the electromagnetic coils 106, the DC power source 109, the radio frequency power source 110, and the like based on the average radio frequency power at the time of heat-retaining discharge and the average radio frequency power at the time of rapid temperature control discharge, which are calculated by the calculation unit 122. At this time, feedback control may be performed using the temperature information of the reactor wall surface 1041 obtained by measuring with the temperature measuring instrument 113. Further, the signal received from the light emitting monitor mechanism 102 may be processed, an end point of the processing of the substrate 107 to be processed by the microwave ECR plasma etching apparatus 100 may be detected, and operations of the microwave power source 101, the electromagnetic coils 106, the DC power source 109, the radio frequency power source 110, and the like may be stopped.

In the microwave ECR plasma etching apparatus 100 including such a configuration, first, microwave power oscillates from the microwave power source 101, and the transmitted microwave power is transmitted to the etching processing chamber 104 through the waveguide 103.

The dielectric window 105 that encloses the etching gas in a lower portion of the etching processing chamber 104 is provided on the upper portion of the etching processing chamber 104, and with the dielectric window 105 as a boundary, the inside of the etching processing chamber 104 below the dielectric window 105 is exhausted by the vacuum exhaust unit 116 and maintained in a vacuum state.

Inside the etching processing chamber 104 held in the vacuum state, the microwave power propagating through the waveguide 103 passes through the dielectric window 105 and is introduced into the etching processing chamber 104 in a state where the etching processing gas whose flow rate is controlled by the gas flow rate control device 115 is supplied from the gas supply unit 114 at a predetermined flow rate.

The electromagnetic coils 106 are arranged around the etching processing chamber 104. An electron cyclotron resonance is generated by the magnetic field formed inside the etching processing chamber 104 by the electromagnetic coils 106 and the microwave power introduced into the etching processing chamber 104 through the dielectric window 105.

With the electron cyclotron resonance generated inside the etching processing chamber 104, the etching gas introduced into the etching processing chamber 104 by a gas introducing means (not shown) can be efficiently converted into plasma.

Further, the light emitting monitor mechanism 102 monitors a light emitting state of the plasma inside the etching processing chamber 104, a light emitting state associated with the etching processing of the substrate 107 to be processed placed on the electrode 108, and the like. The control device 120 receives a light emitting monitor signal from the light emitting monitor mechanism 102 to detect the end point of the etching processing with respect to the substrate 107 to be processed.

Here, as a comparison with this embodiment, FIGS. 2A and 2B shows an example in which the present embodiment is not applied. Normally, when the prior processing of the substrate to be processed by the microwave ECR plasma etching apparatus 100 is ended and the state shifts to an idling state, a temperature 201 of the reactor wall surface 1041 (reactor wall surface temperature) which is the inner wall surface of the etching processing chamber 104 decreases as idling times 211 and 213 elapse.

When the processing of the substrate to be processed is started in a state where the temperature 201 of the reactor wall surface 1041 is lowered in this way, at product processing times 212 and 214, the reactor wall surface temperature 201 raises as the number of processed substrates to be processed increases. That is, as shown in FIGS. 2A and 2B, at a processing time 202 of a first substrate to be processed, the reactor wall surface temperature 201 is the lowest, then at a processing time 203 of a 10th substrate to be processed, the reactor wall surface temperature 201 is raised as compared with the wall surface temperature 201 at the processing time 202 of the first substrate to be processed, and at a processing time 204 of a 25th substrate to be processed, the reactor wall surface temperature 201 is further raised to be substantially equal to a saturation temperature 209.

At this time, in a case where an etching amount of each substrate to be processed depends on the temperature, a phenomenon is observed in which for example, an etching amount 205 of the first substrate to be processed is the lowest, an etching amount 206 of the 10th substrate to be processed is slightly higher than the etching amount of the first substrate to be processed, and an etching amount 207 of the 25th substrate to be processed is further higher than the etching amount 205 of the first substrate to be processed and the etching amount 206 of the 10th substrate to be processed. As a result, a significant discrepancy 208 occurs between the etching amounts of the first and 25th substrates to be processed.

Next, a flow of processing according to the present embodiment will be described using the flowchart shown in FIG. 3.

In the present embodiment, during a period when the prior processing is ended and the apparatus is in the idling state, heat-retaining discharge is performed in which the temperature of the reactor wall surface 1041 is adjusted by plasma discharge formed by the pulse-modulated radio frequency power set to a predetermined average power, and then before starting the processing of the next substrate to be processed, as rapid temperature control discharge, a temperature of a reactor inner wall surface is raised by plasma discharge generated by a predetermined power based on processing conditions of the substrate to be processed. Here, any gas may be used as the gas to be introduced into the processing chamber during the rapid temperature control discharge, but at this time, especially when a gas having the same or similar properties as the product processing conditions is used, the rapid temperature control discharge can also serve as atmosphere adjustment (seasoning) in the processing chamber.

First, the microwave ECR plasma etching apparatus 100 completes the etching process of the substrate to be processed in the prior lot, and the processed substrate whose processing has been ended is carried out from the inside of the etching processing chamber 104. After a lapse of a predetermined time, the microwave power source 101 is controlled by the control device 120 in a state where the inside of the etching processing chamber 104 is exhausted by the vacuum exhaust unit 116 to start a pulse-modulated heat-retaining discharge inside the etching processing chamber 104, so as to control the temperature of the reactor wall surface 1041 to a predetermined temperature (S301). This step S301 is called a heat-retaining discharge step. It is desirable that the start of discharge in this heat-retaining discharge step is immediately after the processed substrate 107 is carried out from the inside of the etching processing chamber 104, but is not limited thereto.

Further, it is desirable that the average radio frequency power (hereinafter referred to as average source power) for plasma generation input from the microwave power source 101 during the period of the heat-retaining discharge is set equal to or greater than a lowest average source power among the product processing conditions registered in advance in the storage unit 121 of the control device 120, and it is desirable that the average source power does not exceed a highest average source power among the product processing conditions registered in advance in the storage unit 121 of the control device 120. This is to quickly bring the temperature of the reactor wall surface 1041 to a predetermined target temperature range in the rapid temperature control discharge (S302) to be performed next.

The average source power at this time is equal to a multiplied value of the source power for plasma generation output from the microwave power source 101 and a Duty of pulse modulation of the source power. When the product processing conditions of the substrate to be processed next are known, it is desirable that the average source power of the heat-retaining discharge step S301 is equal to the average source power of the product processing conditions of the substrate to be processed.

The target temperature range in the present embodiment is a temperature range that falls within a preset allowable value range for the saturation temperature, which is a temperature at which the reactor wall surface 1041 is saturated when the substrate to be processed is processed under the product processing conditions of the target substrate to be processed.

A start signal of the next processing is checked during the heat-retaining discharge (S302), and the processing in the heat-retaining discharge step S301 continues until the start signal of the next processing is received (NO in S302).

On the other hand, when the start signal of the next processing is received during the heat-retaining discharge (YES in S302), the rapid temperature control discharge is immediately started (S303). This step S303 is called a rapid temperature control discharge step. Here, the period of the heat-retaining discharge step S301 and a period of the rapid temperature control discharge step S303 are collectively referred to as an idling state period.

In the rapid temperature control discharge step (S303) performed before starting the processing of the next substrate to be processed, in order to prevent the temperature of the reactor wall surface 1041 from exceeding the above-described target temperature range, the temperature of the reactor wall surface 1041 is raised by plasma discharge generated by setting the average source power of the product processing conditions of the substrate to be processed.

In this way, by performing the rapid temperature control discharge step (S303) before starting the processing of the next substrate 107 to be processed, the temperature of the reactor wall surface 1041 is within the target temperature range at a time of processing a first substrate to be processed in the processing of the next substrate 107 to be processed, and thus in a series of processing of the substrates to be processed, the first substrate to be processed and the last substrate to be processed can be processed with almost the same quality.

In a case where the product processing conditions of the substrate to be processed next are known in advance and the average source power of the heat-retaining discharge step S301 is equal to the average source power of the product processing conditions of the substrate to be processed, the average source power in the rapid temperature control discharge step S303 continues the average source power set in the heat-retaining discharge step S301.

After performing the rapid temperature control discharge step in S303 for a predetermined time, the substrate 107 to be processed is carried into the etching processing chamber 104 (S304) and placed on the electrode 108. In this state, the control device 120 operates the DC power source 109 to electrostatically attract the substrate 107 to be processed to the electrode 108, the gas supply unit 114 supplies the processing gas to the inside of the etching processing chamber 104 while the vacuum exhaust unit 116 exhausts the inside of the etching processing chamber 104 to a vacuum, and the electromagnetic coils 106 are energized to generate the magnetic field inside the etching processing chamber 104.

Next, the microwave power transmitted from the microwave power source 101 is supplied from the dielectric window 105 to the inside of the etching processing chamber 104 through the waveguide 103. The electron cyclotron resonance is generated by the magnetic field formed inside the etching processing chamber 104 and the microwave power introduced inside the etching processing chamber 104, and the etching gas introduced into the etching processing chamber 104 can efficiently be converted into plasma.

In this state, by controlling by the control device 120 and adjusting the radio frequency power applied from the radio frequency power source 110 to the electrode 108, the amount of ions (ion current) incident on the substrate 107 to be processed placed on the electrode 108 from the plasma is adjusted to performed the plasma processing on the substrate 107 to be processed under conditions suitable for processing the substrate 107 to be processed (S305). This step is called a product processing step. In this product processing step S305, the light emitting state of the plasma during the plasma processing is monitored using the light emitting monitor mechanism 102. When the light emitting monitor mechanism 102 detects the end point of the plasma processing for the substrate 107 to be processed, the control device 120 controls the plasma processing to end the plasma processing.

The processed substrate 107 for which the product processing step S305 has been ended is carried out from the etching processing chamber 104 using a carrying out means (not shown) (S306).

Here, it is determined whether there is an unprocessed substrate to be processed in the same lot (S307), and when there is an unprocessed substrate to be processed (YES in S307), the process is returned to S304, the next unprocessed substrate 107 to be processed is carried into the etching processing chamber 104. The above processing is repeated until the processing of all the substrates to be processed in the same lot is completed.

When there is no unprocessed substrate to be processed in the lot (NO in S307), it is determined whether there is a next processing lot (S308), and when there is a next processing lot (YES in S308), the process is returned to S301, and the heat-retaining discharge step is executed in step S301 for a time until the next processing lot is charged into the etching processing chamber 104.

On the other hand, when there is no next processing lot (NO in S308), the processing is ended. These series of steps are controlled and executed by the CPU 123 based on the programs and product processing conditions which are stored in the storage unit 121 of the control device 120 and used for processing the substrates 107 to be processed by the microwave ECR plasma etching apparatus 100.

The above-described embodiment has been described in which the average source power input from the microwave power source 101 to the etching processing chamber 104 in the rapid temperature control discharge step S303 is the average source power of the product processing conditions of the substrate to be processed next, but this average source power may be set to a value obtained by calculation of the calculation unit 122 so that a time from the temperature of the reactor wall surface 1041 raised by the heat-retaining discharge obtained by the temperature measuring instrument 113 to the time until the target saturation temperature range is reached becomes a predetermined value.

In the above-described embodiment, FIG. 4 shows a temperature transition 401 of the reactor wall surface 1041, which is obtained by measuring with the temperature measuring instrument 113, in an idling state time 411 of the heat-retaining discharge step S301 and the rapid temperature control discharge step S303, and a substrate processing period 412 in the product processing step S305.

During a heat-retaining discharge period 404 in which the heat-retaining discharge step S301 is executed during the idling state time 411, the reactor wall surface 1041 is adjusted so that an average temperature 403 becomes a constant temperature. The average temperature 403 of the reactor wall surface 1041 at this time is uniquely determined by the average source power input in the heat-retaining discharge step S301 during the heat-retaining discharge period 404.

It is desirable that the average source power at this time is equal to the lowest average source power among the substrate processing conditions registered in advance in the control device 120, and even if the average source power at this time is higher than the lowest average source power, it is desirable that the average source power at this time does not exceed the highest average source power among the substrate processing conditions registered in advance in the control device 120.

During the heat-retaining discharge step (S301) (the heat-retaining discharge period 404 is being executed at the idling state time 411), when a start signal of the next processing is received at a time $T_0$ (YES in S302), the heat-retaining discharge period 404 is ended, the process immediately shifts to the rapid temperature control discharge step (S303), and the rapid temperature control discharge is performed for a predetermined time 405 until a time $T_1$.

At this time, by executing the heat-retaining discharge step (S301) for a sufficient time during the heat-retaining discharge period 404 before the time $T_0$ at which the rapid temperature control discharge step (S303) is performed, the temperature transition 401 of the reactor wall surface 1041 is sufficiently kept warm at the average temperature 403, and thus if a time 405 for performing the rapid temperature control discharging step (S303) is long enough, the temperature of the reactor wall surface 1041 quickly reaches the saturation temperature 402, which is the target temperature. Therefore, the temperature transition 401 of the reactor wall surface 1041 during the product processing step (S305) becomes extremely asymptotic to the saturation temperature 402 immediately after the product processing start time $T_1$.

Here, the time 405 for executing the rapid temperature control discharging step (S303) may be a time stored in the preset storage unit 121 or a time obtained by the calculation unit 122.

As a method of obtaining the time by calculation unit 122, the time is obtained based on a difference between the average temperature 403 set in the heat-retaining discharge step (S301) and the saturation temperature 402 of the reactor wall surface 1041 according to the product processing conditions of the substrate 107 to be processed and temperature rise characteristics of the reactor wall surface 1041 under the discharge conditions in the rapid temperature control discharge step (S303). Here, the saturation temperature 402 of the reactor wall surface 1041 according to the product processing conditions of the substrate 107 to be processed in the product processing step (S305) and the temperature rise characteristic of the reactor wall surface 1041 due to the discharge condition in the rapid temperature control discharge step (S303) can be obtained by measuring with the temperature measuring instrument 113 while generating plasma with varying the discharge conditions in advance and based on a relationship between the discharge conditions and temperature rise data of the reactor wall surface 1041 that are stored in the storage unit 121.

Figures 5A, 5B:
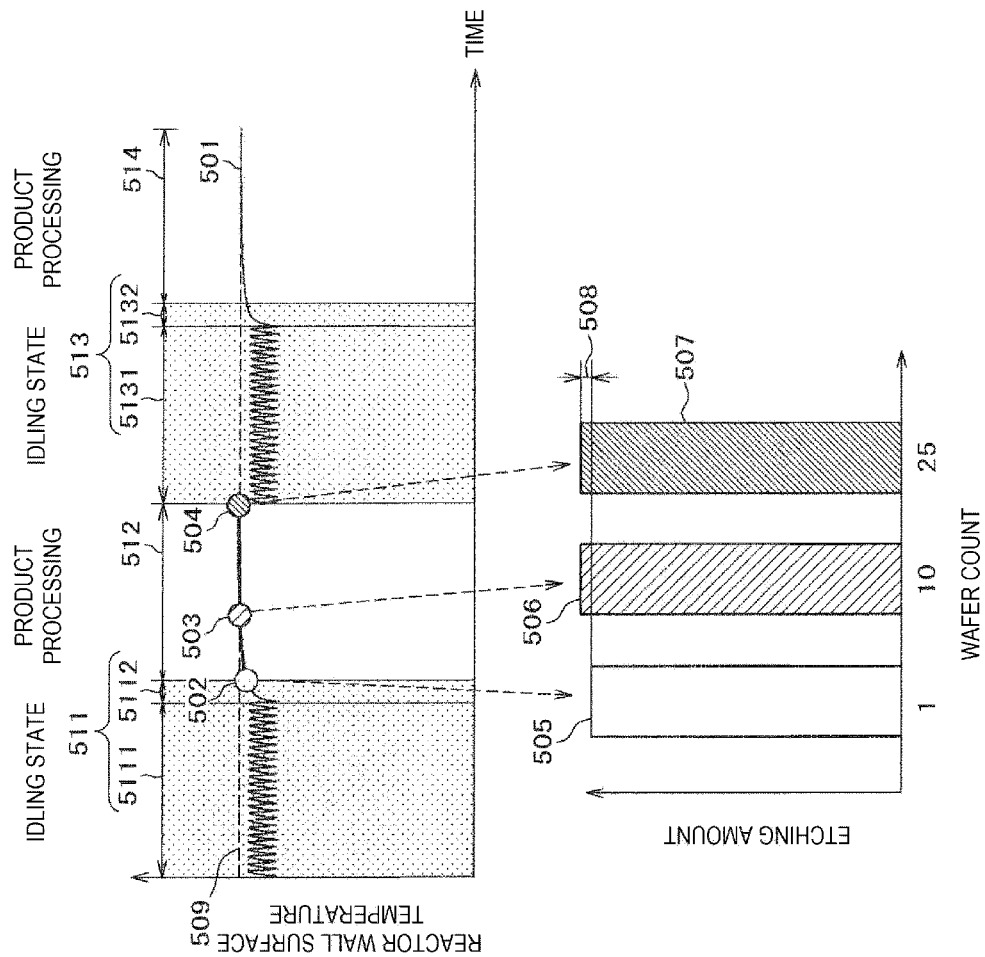
FIG. 5A is a graph showing relationships of the idling state and the product processing time of the substrate to be processed with the reactor wall surface temperature when the invention is applied.
FIG. 5B is a graph showing a relationship between a wafer count and an etching amount when the invention is applied.

FIGS. 5A and 5B shows the effects of the present embodiment. FIGS. 5A and 5B shows a temperature transition 501 of the reactor wall surface 1041 obtained by measuring with the temperature measuring instrument 113, an etching amount 505 of the first substrate 107 to be processed in the product processing, an etching amount 506 of the 10th substrate 107 to be processed in the product processing, and an etching amount 507 of the 25th substrate 107 to be processed in the product processing in the product processing step (S305) in the present embodiment.

As described above, according to the present embodiment, by maintaining the temperature of the reactor wall surface 1041 at a constant temperature by the heat-retaining discharge step (S301) during the idling state time 411 and performing the rapid temperature control discharge step (S303) immediately before the start of product processing, a temperature 502 of the reactor wall surface 1041 at the time of the first substrate to be processed in the product processing is extremely asymptotic to a saturation temperature 509 of the product processing conditions.

Therefore, differences between the temperature 502 of the reactor wall surface 1041 at the time of the first substrate to be processed in the product processing, a temperature 503 of the reactor wall surface 1041 at the time of the 10th substrate to be processed in the product processing, and a temperature 504 of the reactor wall surface 1041 at the time of the 25th substrate to be processed in the product processing are extremely small as compared with the case where the present embodiment is not applied. At this time, when the etching amount of the substrate 107 to be processed depends on the temperature, a difference 508 between an etching amount 505 of the first substrate to be processed and an etching amount 507 of the 25th substrate to be processed is extremely small as compared with the case where the present embodiment is not applied.

As described above, according to the present embodiment, it is possible to prevent a phenomenon, that is, during lot processing of the plurality of substrates using the plasma processing apparatus, because the temperature of the chamber wall surface changes due to plasma heat input, an initial temperature in the lot processing is significantly dissociated from the saturation temperature in the lot processing, which causes a difference in etching rate and the like within the same lot, resulting in a decrease in yield.

That is, according to this embodiment, the temperature of the reactor wall surface 1041 at the start of the lot processing of the substrates to be processed can be adjusted to near the saturation temperature of the reactor wall surface 1041 that is reached when the processing is continued under the product processing conditions of the lot of the substrates to be processed, variations due to temperature dependence of the etching rates in the lot can be suppressed, and the yield in the etching process can be stably maintained in a high state.

While the invention made by the inventor has been described in detail based on the embodiment, the invention is not limited to the above-described embodiment, and various modifications can be made without departing from the scope of the invention. For example, the above-described embodiment has been described in detail for easy understanding of the invention, and the invention is not necessarily limited to those including all the configurations described above. In addition, a part of the configuration of each embodiment may be added, deleted, or replaced with another configuration.

REFERENCE SIGN LIST 100 microwave ECR plasma etching apparatus
101 microwave power source
102 light emitting monitor mechanism
103 waveguide
104 etching processing chamber
105 dielectric window
106 electromagnetic coil
107 substrate to be processed
108 electrode
109 DC power source
110 radio frequency power source
111 radio frequency filter circuit
112 matching circuit
113 temperature measuring instrument
120 control device

The invention claimed is:

1. A plasma processing apparatus, comprising: a processing chamber in which a sample is subjected to plasma processing; a microwave power source configured to supply pulse-modulated microwave power via a dielectric window of the processing chamber for generating plasma in the processing chamber; and a control device comprising a processor configured to execute instructions to control of performing a first process of heat-retaining discharge during an idling period between a lot processing and a subsequent lot processing, each lot processing being a plasma processing for a single sample or a plasma processing for a plurality of samples, by controlling the microwave power source to cause a temperature of an inner wall of the processing chamber to maintain a desired first temperature using the plasma generated by the pulse-modulated microwave power, and wherein the control device is further configured to execute control of performing a second process of rapid temperature control discharge by controlling the microwave power source to cause the temperature of the inner wall of the processing chamber to increase to a second temperature higher than the desired first temperature after the first process.

2. The plasma processing apparatus according to claim 1, wherein an average radio frequency power, which is a product of the pulse-modulated microwave power and a duty ratio of a pulse-modulation of the microwave power, is a value obtained based on microwave power specified in a plasma processing condition of a lot plasma processing.

3. The plasma processing apparatus according to claim 2, wherein a radio frequency power for generating plasma used in the second process is the same as a radio frequency power specified in the plasma processing condition of the lot plasma processing.

* * * * *